United States Patent [19]

Hermansdorfer et al.

[11] 4,430,640
[45] Feb. 7, 1984

[54] STEP DATA TO SYNCHRO CONVERTER

[75] Inventors: James E. Hermansdorfer; William T. Spurgin, both of Charlottesville, Va.

[73] Assignee: Sperry Corporation, New York, N.Y.

[21] Appl. No.: 229,478

[22] Filed: Jan. 29, 1981

[51] Int. Cl.³ .............................................. H03K 13/00
[52] U.S. Cl. ........................ 340/347 SY; 340/347 DD; 318/654
[58] Field of Search ............... 318/605, 654, 685, 696; 364/816; 328/13, 14; 340/347 SY, 347 DA

[56] References Cited

U.S. PATENT DOCUMENTS

| | | | |
|---|---|---|---|
| 3,359,474 | 12/1967 | Welch | 318/696 |
| 3,488,653 | 1/1970 | Rasche | 340/347 DA |
| 3,829,752 | 8/1974 | Martines | 340/347 SY |
| 4,270,120 | 5/1981 | Prill | 340/347 SY |

Primary Examiner—C. D. Miller
Attorney, Agent, or Firm—Howard P. Terry

[57] ABSTRACT

A step data to synchro converter for coupling one of a plurality of different step data transmitters to one of a plurality of different synchro receivers. The output of the step data transmitter is applied to an interface circuit and processed into a three bit binary code suitable for actuating a plurality of switching means. The switching means selectively apply an in-phase and an out-of-phase output of a transformer, which is responsive to the synchro receiver's reference voltage and frequency source, to a plurality of transformers associated with the input stator windings of the synchro receiver. The output of the plurality of transformers is a drive signal which satisfactorily approximates synchro data.

3 Claims, 6 Drawing Figures

| DATA CYCLE CODE | | | | | | |
|---|---|---|---|---|---|---|
| | 1 | 2 | 3 | 4 | 5 | 6 |
| A | 1 | 1 | 1 | 0 | 0 | 0 |
| B | 0 | 0 | 1 | 1 | 1 | 0 |
| C | 1 | 0 | 0 | 0 | 1 | 1 |

STEP DATA TO SYNCHRO CONVERTER

BACKGROUND OF THE INVENTION

1. Field of the Invention

This invention relates to digital-to-analog converters, and more specifically to a step data to snychro converter useful for driving a synchro receiver with the output data of a step data transmitter.

2. Description of the Prior Art

Step data transmitters (encoders) are electromechanical digital data output devices for transforming an angular position input into a digital electrical output, whereas synchro receivers are electromechanical analog input devices having a rotor and a plurality of stator windings for transforming electrical analog signals into rotational mechanical movement. It is to be understood that the term "synchro receiver" used herein encompasses both synchro torque receivers and synchro servo systems where torque is developed by a servo system controlled by a synchro. Since step data transmitters are digital data output devices, and since synchro receivers are analog data input devices, there is a need for a converter whenever it is desired to use step data output to position a synchro receiver. The requirement of step data-to-synchro conversion is frequently encountered in the art of shipboard navigation systems in which gyrocompasses having step data output, typically at 360x data transmission speed (1 data cycle per degree of heading), are operatively coupled to repeaters, radar equipment, and autopilots designed for synchro data input, typically at 360x data transmission speed (1 synchro revolution per degree of heading). The data conversion requirement is often further complicated when the gyrocompass of one manufacturer is operatively coupled to the synchro data input device of another manufacturer, since different manufacturers typically utilize different types of step data output and/or synchro data input.

A digital-to-synchro converter well adapted to convert ten bit binary coded information to synchro output data is disclosed in U.S. Pat. No. 3,488,653 entitled "Digital-to-Synchro Converter", and assigned to the Applicants' assignee. The above referenced converter is designed such that digitally coded information representing an unknown angle is stored in a register. A counter is continually actuated by an A.C. reference voltage. The binary state of each counter stage is continually compared with that of the corresponding register stage. The results of the comparison are applied to a logic circuit which provides an output pulse each time that angular displacement of the A.C. reference voltage equals one of eight predetermined functions of the unknown angle. A second logic means produces two trains of rectangular pulses having duty cycles determined by the time intervals between specified pairs of pulses. The rectangular pulses are passed through filters that remove the harmonics, leaving sinusoidal waves. The sinusoidal waves are applied to a Scott T transformer which converts these waves into voltages suitable for actuating a synchro receiver.

The above described converter, however, is not designed to convert one of a plurality of different step data outputs into one of a plurality of different synchro data inputs.

Accordingly, there is a need for a step data to synchro converter which is capable of performing conversions among the various types of step data outputs and synchro data inputs. In the shipboard navigation systems art, for example, there is a particular need for such a device since it would provide for the efficient operative coupling of gyrocompasses providing step data output and synchro data input equipment manufactured by different manufacturers which heretofore have been considered incompatible without the costly design of a unique converter limited to a particular application.

SUMMARY OF THE INVENTION

According to the practice of the present invention, a step data to synchro converter converts one of a plurality of different step data outputs to one of a plurality of different synchro data inputs. The interface circuit or receiving means of the converter is capable of receiving step data signals from a step data transmitter at any voltage and in any format, e.g., four phase five wire type, three phase four wire type, etc., and if necessary, transforming the step data to a three bit binary step data code so defined in the truth table of FIG. 5. This code will be called "Standard Step Code" hereinafter. The converter further includes a transformer or means for receiving the reference voltage associated with the rotor winding of a particular synchro receiver and for providing an in-phase and out-of-phase a.c. signal from the reference voltage. Switching means responsive to the step data signals is operative to selectively apply the in-phase and out-of-phase a.c. signals to output means, preferably comprised of a plurality of transformers. The voltages induced in the secondary windings of the transformers are analog electrical signals suitable for driving the particular synchro receiver in a stepwise manner, with each step representing 1/6 revolution of the synchro receiver.

DESCRIPTION OF THE PREFERRED EMBODIMENT

Figure 1:
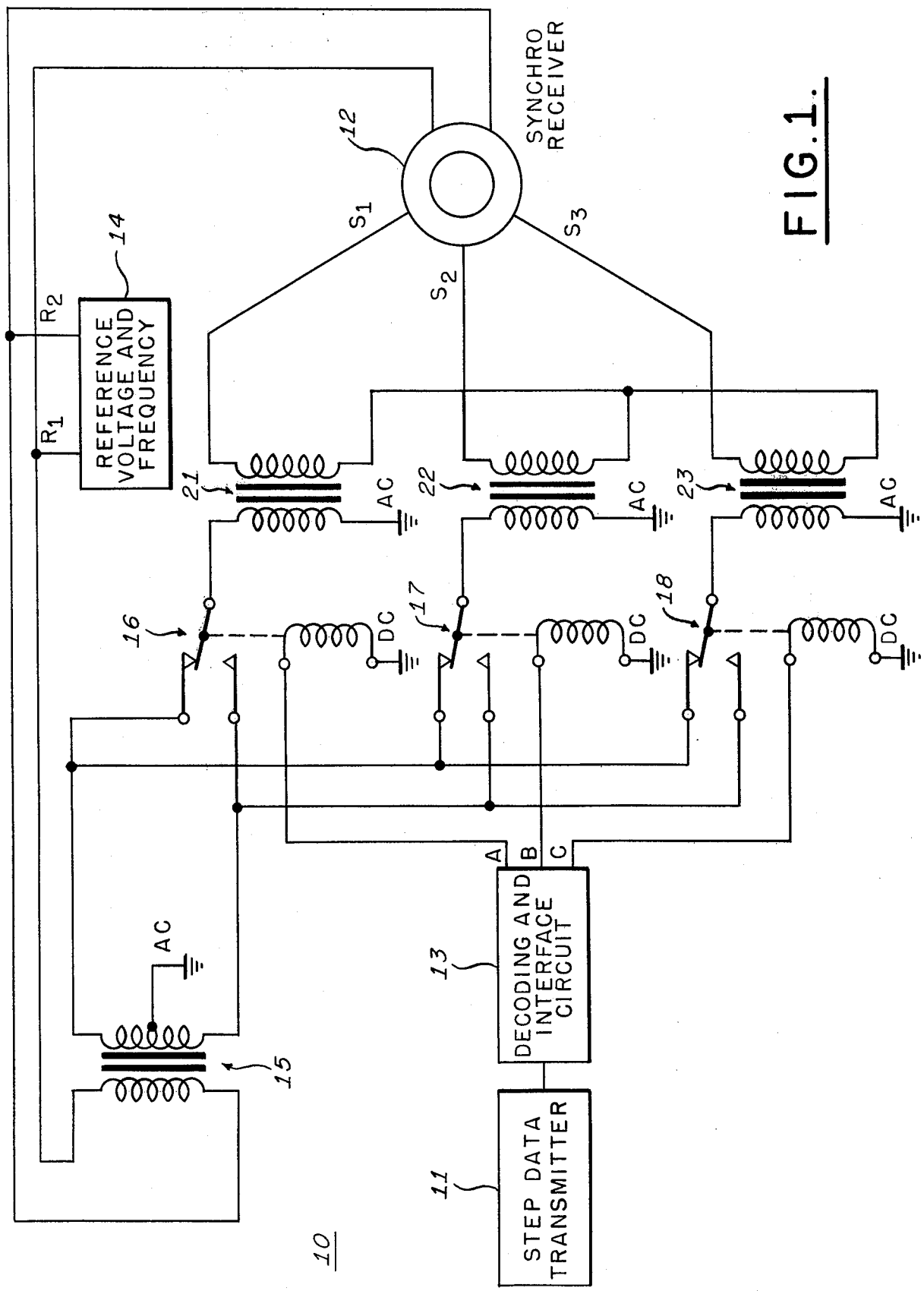
FIG. 1 is a functional block diagram of the apparatus of the present invention.

Referring now to FIG. 1, a functional block diagram illustrates a step data to synchro converter 10 in its most simple form. The converter 10 provides a direct logical conversion of 360x step data drom step data transmitter 11 to 360x synchro data suitable for synchro receiver 12. It is to be understood that by referring to step data as e.g., "360x", it is meant that there is one complete step data cycle per degree of heading or other angular parameter, even through a 2-pole variable reluctance step motor driven by such step data will, because of its principles of operation, rotate at 180x with respect to the measured heading or other angular parameter. It should be noted, however, that with appropriate modifications the converter 10 may be adapted to convert one of a plurality of different step data outputs into one of a plurality of synchro data inputs and in no way is the apparatus of the present invention limited to the conversion of 360x step data into 360x synchro data. On the other hand, the present invention does cause the synchro receiver to move in a stepwise fashion, with the finest possible resolution being 1/6 of a revolution of the synchro; it is therefore most suitable for applications where the synchro receiver and the step data are at high data transmission speeds, e.g., 180x or 360x, so that system resolution will not be unduly affected by the conversion.

The converter 10 receives the output of the step data transmitter 11 via a decoding and interface circuit 13, processes the step data, and applies the converted output to the synchro receiver 12 via the leads S1, S2, and S3. If the step data transmitter 11 is of the 3-phase, 4 wire type using the standard step code format of FIG. 5 and is at the same data transmission speed as the synchro receiver 12, no decoding is required. If, on the other hand, any other format of step data is used, and/or if the data transmission speed of the step data transmitter 11 is different from that of the synchro receiver 12, decoding must be performed to convert the step data pulses to the standard step code of FIG. 5 at the synchro receiver's data transmission speed.

It is intrinsic in the present invention that the resolution of the synchro receiver 12, defined in terms of the heading or other angular parameter being measured, can never be greater than that of the step data transmitter 11. The synchro receiver 12 includes input leads R1, R2 which provide the synchro receiver 12 with a reference voltage and frequency for application to its rotor. The leads R1, R2 are coupled to a reference voltage and frequency source 14. Also coupled to the reference voltage and frequency source 14 is the primary winding of a transformer 15. The secondary winding of the transformer 15 includes a center tap which is grounded and includes output taps which are coupled to switching means comprised of relays 16, 17, and 18. The apparatus of the present invention is shown as including the electromechanical relays 16, 17 and 18, but it should be noted that it would be obvious to those skilled in the art to substitute semiconductor switches or other suitable switching means for the relays. The relays 16, 17, 18 are actuated by the output of the interface device 13 to select a fixed amplitude voltage of either in-phase (0°) or out-of-phase (180°). The relays 16, 17, 18 apply these in-phase and out-of-phase voltages to an input tap of the primary windings of transformers 21, 22, 23. The primary windings of transformers 21, 22, 23 are connected to ground by a second tap. The secondary windings of the transformers 21, 22, 23 are coupled to the input leads S1, S2, S3 of the synchro receiver 12.

Figure 2:
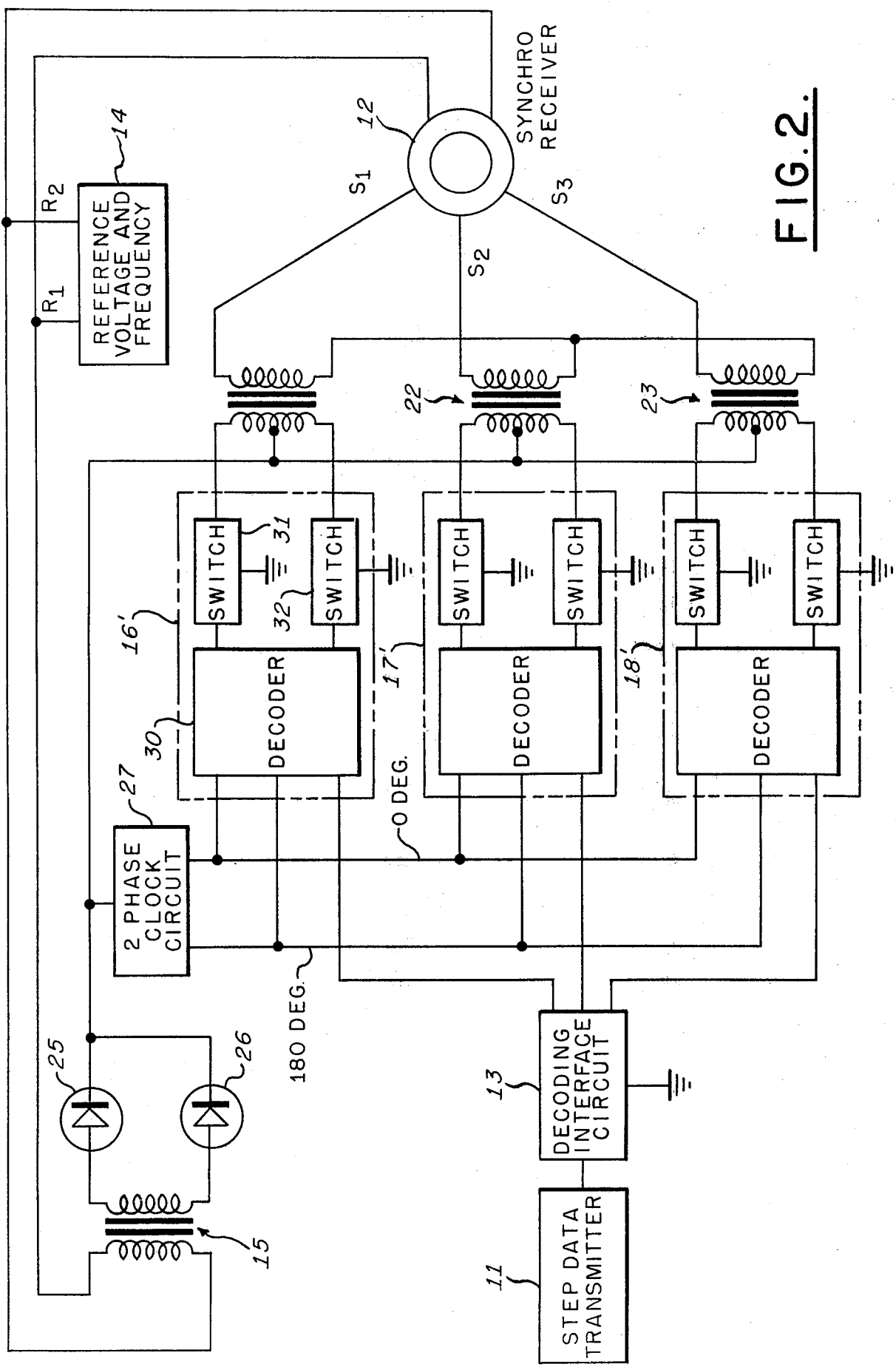
FIG. 2 is a block diagram of an alternate embodiment of the present invention.

Referring now to FIG. 2, a functional block diagram of an alternate embodiment of the present invention is provided. The converter 10 of FIG. 2 receives the output of step data transmitter 11, processes the step data, and applies the converted output to the synchro receiver 12. Unlike the converter 10 of FIG. 1, the converter 10 of FIG. 2 reverses the selection of the in-phase (0°) and out-of-phase (180°) output of the reference transformer 15 when the output is applied to the transformers 21, 22, 23. The output of the transformers 21, 22, 23 is applied to the synchro receiver 12 via the stator winding leads S1, S2, S3. The reference voltage and frequency source 14 is coupled to the synchro receiver 12 and to the transformer 15 by the leads R1, R2. The secondary winding of the transformer 15 includes a center tap which is grounded and the secondary winding is coupled via diodes 25, 26 to a two-phase clock circuit 27. Preferably, the two phase clock circuit 27 is comprised of a crossover detector and a dual one shot to provide a gating signal for the switching means 16', 17', 18' which are comprised of a decoder 30 and switches 31, 32.

Figures 2A, 5:
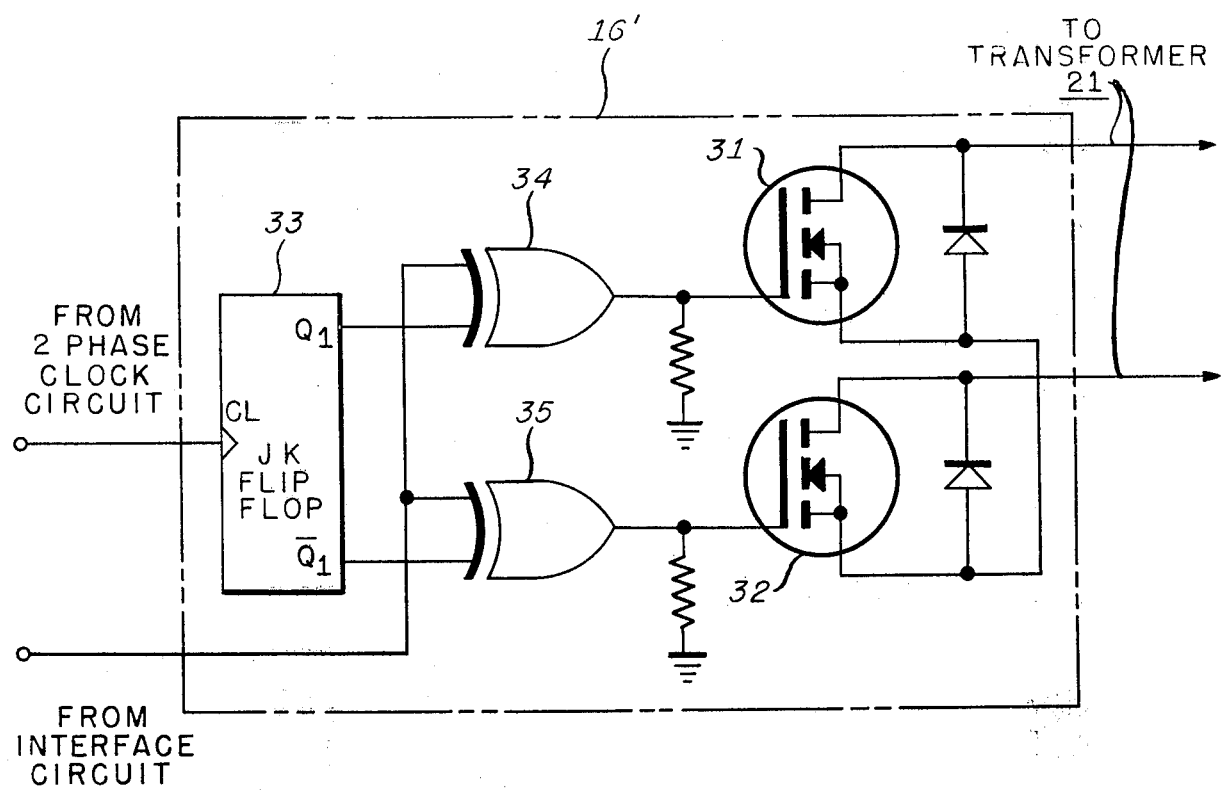
FIG. 2a is a schematic of the switching means of the present invention.
FIG. 5 is a truth table summarizing the three bit binary step data code herein called Standard Step Code.

Referring now to FIG. 2a, a schematic of the switching means 16' is provided. It should be noted that switching means 17', 18', are identical to switching means 16', but for the purposes of simplicity, only a description of the switching means 16' is provided. The switching means 16' includes a decoder 30 preferably comprised of a J-K flip-flop 33 and a pair of exclusive OR gates 34, 35. The J input, the K input, the preset input, and the clear input of the J-K flip-flop 33 are all held high, thereby providing a toggled output at the Q, Q outputs of the J-K flip-flop 33 in response to the two-phase clock circuit 27 output applied to the clock input. The exclusive OR gates 34, 35 are responsive to the Q, Q outputs of the J-K flip-flop 33 and the output of the interface circuit 13. The outputs of the exclusive OR gates 34, 35 are applied to transistor switches 31, 32 which are preferably power VMOS field effect transistors, e.g., the commercially procurable integrated circuit sold by Siliconix as Part No. VN64GA. The output of the switches 31, 32 are applied to the primary winding of transformer 21 which has a center tap coupled to the output of the transformer 15. The output of switching means 17', 18' are likewise coupled to the primary windings of transformers 22, 23. The secondary windings of transformers 21, 22, 23 are coupled to the synchro receiver 12 by the leads S1, S2, S3.

Referring now to FIG. 5, a three bit binary data cycle code or gray code is provided in a tabular format. This code has previously been designated Standard Step Code. It is well known to those skilled in the art that a step data transmitter can be used to position a step motor using the gray code of FIG. 5. A step data transmitter of the type utilizing the gray code of FIG. 5 typically has three output lines and provides six commands to rotate the rotor of a 2-pole variable reluctance step motor 180°. Each position command includes three bits of data and each bit is provided on an output line. As previously noted, to rotate a 2-pole variable reluctance step motor through 360°, the step data transmitter would have to provide twelve position commands, the second six position commands merely repeating the first six position commands, thereby comprising two data cycles. It is also well known to those skilled in the art that the clockwise or counterclockwise rotation of a step motor may be commanded by providing the position commands in either a descending or ascending order.

Figures 3, 4:
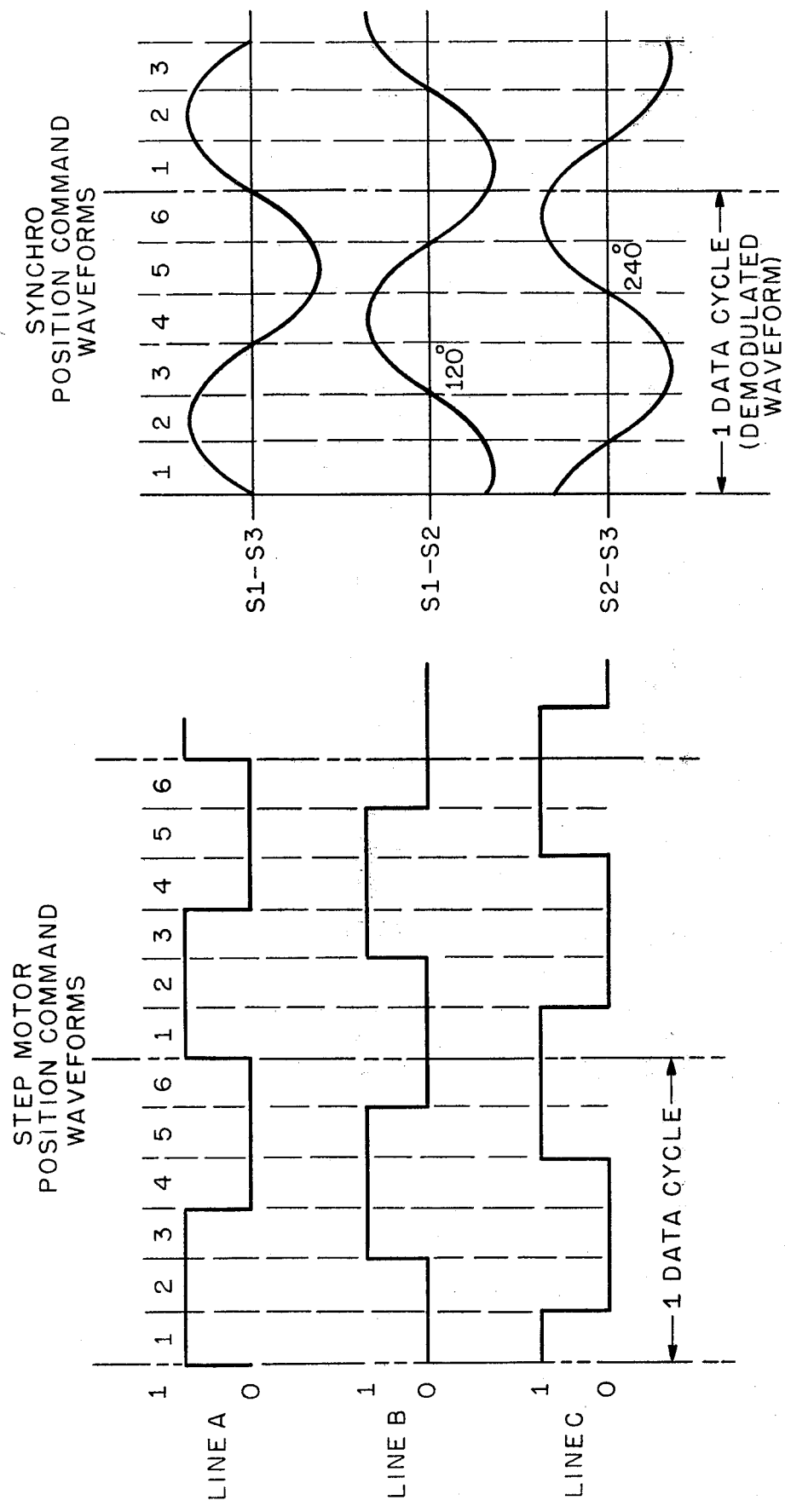
FIG. 3 is a diagram of typical step data waveforms.
FIG. 4 is a diagram of typical synchro data waveforms.

In FIG. 3, the waveforms designated as A, B, C represent the output waveforms on the output lines of the 360x step data transmitter 11 during one data cycle. During that portion of the waveforms of FIG. 3, which correspond to position command 1, it can be appreciated that the step data transmitter's output line A is at a logic 1, line B is at a logic 0 and line C is at logic 1. Referring to FIG. 5, it is further appreciated that the logic states of output lines A, B, C, correspond to the first position command 101 of the data cycle code. Accordingly, all six position commands of one data cycle may be represented by the output of output lines A, B, C.

In FIG. 4, the sinusoidal curves S1, S2, S3 are representative of the amplitude of the a.c. voltages of the various stator winding input leads S1, S2, S3 to the synchro receiver 12 during one data cycle. An object of the present invention is to have converter 10 convert the waveforms of FIG. 3 to the six polarity states of the demodulated waveforms of FIG. 4.

In operation, the apparatus of the present invention converts step data waveforms having the six states of the gray code of FIG. 5, where one cycle of step data equals, e.g., 1° of heading into six synchro vectors representing 60° of synchro rotation. For explanation purposes, the converter 10 of FIG. 1 will be described as converting the output of the 360x step data transmitter 11 which provides step data in a three-phase four wire format to a format suitable for driving the 360x synchro receiver 12. If the step data transmitter 11 is not of a 360x type or does not provide a three-phase four wire output and/or the synchro receiver 12 is not of a 360x type, then the interface circuit 13 must include decoding means to realize the full capability of the apparatus of the present invention. The interface circuit 13, therefore, should include decoding means comprised of TTL logic circuits or a suitably programmed microprocessor. Such decoding means would compensate for the relative shaft speeds of the step data transmitter 11 and the synchro receiver 12 and would convert the output of the step data transmitter 11 from its output format into the three-phase four wire step data format of FIG. 5 (if necessary). It would be obvious to one skilled in the art to design such a logic circuit or to program a microprocessor in such a fashion. Moreover, the interface circuit 13 of both FIGS. 1 and 2, preferably includes buffer amplifiers and isolators, of the type manufactured by Monsanto and sold as part No. 4N25. Once the interface circuit 13 has processed the output of the step data transmitter 11 into the three phase four wire format (if necessary), the output of the interface circuit 13 is utilized by switching means 16, 17, 18 to select a fixed amplitude voltage of either in-phase (0°) or out-of-phase (180°) from the transformer 15 for application to the primary windings of the transformers 21, 22, 23. The output of the secondary windings of transformers 21, 22, 23 approximates the waveforms of FIGS. 4 and is suitable for driving the synchro receiver 12 in a stepwise fashion.

It can be appreciated from FIGS. 1 and 3 that when line A is at a logic state 1, line B is at a logic state 0, and line C is at a logic state 1, the step data transmitter 11 is providing the first position command of the gray code illustrated in FIG. 5. Since the contacts of switches 16, 17, 18 are all coupled to the output taps of the secondary winding of the transformer 15, either an in-phase or an out-of-phase voltage will be coupled to the transformers 21, 22, 23 depending upon the positions of switches 16, 17, 18. Thus, for example, when the step data command signal 101 is utilized to actuate the switches 16, 17, 18 an in-phase voltage will be coupled to transformers 21, 23 and an out-of-phase voltage would be coupled to transformer 22. Furthermore, when the second position command signal 100 is applied to switches 16, 17, 18, an in-phase voltage is applied to transformer 21 and out-of-phase voltages are applied to transformers 22, 23. Accordingly, as the step data command signals actuate switches 16, 17, 18, the in-phase and out-of-phase voltages which are applied to the primary coils of transformers 21, 22, 23 induce the generally sinusoidal waveforms S1, S2, S3 of FIG. 4 in the secondary windings of the transformers 21, 22, 23, thereby providing the synchro receiver 12 with a suitable drive signal. It should be noted, however, that the resulting drive signal is not the smooth continuous synchro data similar to a three-phase sinusoidal waveform which provides infinite resolution of the transmitted position angle. Instead, the apparatus of the present invention transmits a position angle in discrete steps as commanded by the step data which satisfactorily approximates the smooth continuous synchro data.

While the invention has been described in its preferred embodiments, it is to be understood that the words which have been used are words of description rather than limitation and that changes may be made within the purview of the appended claims without departing from the true scope and spirit of the invention in its broader aspects.

We claim:
1. A step data-to-synchro converter adapted to receive data signals from a step data transmitter in a three bit binary step data format, and provide therefrom analog signals to a synchro receiver, comprising:
   a reference signal source having a selected frequency;
   a reference transformer, coupled to said reference signal source, for providing in-phase and out-of-phase a.c. signals having a fixed amplitude;
   switching means, coupled to said reference transformer and responsive to said data signals from said step data transmitter, for selecting combinations of said in-phase and out-of-phase a.c. signals; and
   a plurality of output transformers, for providing analog data signals to drive said synchro receiver, each of said output transformers coupled to a corresponding output terminal of said switching means, and each having terminal means for coupling to a corresponding input terminal of said synchro receiver.

2. An apparatus as in claim 1 wherein said switching means includes a plurality of switches, each of said switches having input terminal means coupled to said reference transformer, and output terminal means coupled to a corresponding one of said output transformers.

3. An apparatus as in claim 2 wherein each of said switches comprises a transistor switch.

* * * * *